United States Patent
Lutich

(10) Patent No.: US 9,875,334 B2
(45) Date of Patent: *Jan. 23, 2018

(54) GENERATING MANUFACTURABLE SUB-RESOLUTION ASSIST FEATURE SHAPES FROM A USEFULNESS MAP

(71) Applicant: GLOBALFOUNDRIES Inc., Grand Cayman (KY)

(72) Inventor: Andrey Lutich, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 86 days.

This patent is subject to a terminal disclaimer.

(21) Appl. No.: 15/155,425

(22) Filed: May 16, 2016

(65) Prior Publication Data

US 2017/0329886 A1    Nov. 16, 2017

(51) Int. Cl.
*G06F 17/50* (2006.01)
*G03F 1/70* (2012.01)

(52) U.S. Cl.
CPC ............ *G06F 17/5081* (2013.01); *G03F 1/70* (2013.01)

(58) Field of Classification Search
CPC .......... G03F 1/36; G03F 1/84; G03F 7/70441; G03F 7/70433; G03F 1/144; G03F 1/70; G01N 21/956; G06F 17/5081; G06F 17/30587; G06F 17/5068; G06F 17/5072
USPC .................................... 716/50–56; 430/5, 30
See application file for complete search history.

(56) References Cited

U.S. PATENT DOCUMENTS 9,754,068 B2 * 9/2017 Lutich ................ G06F 17/5081
2005/0053848 A1 * 3/2005 Wampler .................. G03F 1/36
430/5

* cited by examiner

*Primary Examiner* — Nghia Doan
(74) *Attorney, Agent, or Firm* — Amerson Law Firm, PLLC

(57) ABSTRACT

An illustrative method includes providing a layout of at least a portion of a photomask, the layout comprising a plurality of target features, each target feature having a shape in accordance with a corresponding one of at least one target shape, for each of the target shapes, providing a local map specifying a respective value of a local sub-resolution assist feature (SRAF) usefulness for each of a plurality of positions relative to the target shape, generating a global usefulness map specifying a respective global SRAF usefulness for each of the plurality of positions relative to at least a portion of the photomask on the basis of the assignment of the values of the local SRAF usefulness.

17 Claims, 9 Drawing Sheets

FIG. 5 though the photomask is used in a photolithography process, it is important to note that typically no features corresponding to the SRAFs are formed in the photoresist mask that is provided on the semiconductor structure. In other words, SRAF features are not printed. Instead, the presence of SRAFs may reduce a sensitivity of the photolithography process with respect to variations of parameters of the photolithography process. Such parameters may include, in particular, a focus of the projection and a dose of the radiation used for projecting the photomask to the photoresist.

GENERATING MANUFACTURABLE SUB-RESOLUTION ASSIST FEATURE SHAPES FROM A USEFULNESS MAP

BACKGROUND OF THE INVENTION

1. Field of the Invention

Generally, the present disclosure relates to the manufacturing of integrated circuits, and, more particularly, to the creation of photomasks for use in photolithographic processes.

2. Description of the Related Art

Integrated circuits typically include a large number of circuit elements which include, in particular, field effect transistors. Other types of circuit elements which may be present in integrated circuits include capacitors, diodes and resistors. The circuit elements in an integrated circuit may be electrically connected by means of electrically conductive metal lines formed in a dielectric material, for example, by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

Due to the complexity of modern integrated circuits, in the design of integrated circuits, automated design techniques are typically employed.

The design of an integrated circuit typically employs a number of steps. These steps may include the creation of a user specification that defines the functionality of the integrated circuit. The user specification may be the basis for the creation of a register transfer level description that models the integrated circuit in terms of a flow of signals between hardware registers and logical operations performed on those signals. The register transfer level description of the integrated circuit may then be used for the physical design of the integrated circuit, wherein a layout of the integrated circuit is created. The thus-created layout may be the basis for the formation of photomasks that may be employed for patterning materials in the manufacturing of the integrated circuit by means of photolithography processes.

In a photolithography process, a photomask is projected to a layer of a photoresist that is provided over a semiconductor structure. Portions of the photoresist are irradiated with radiation that is used for projecting the photomask to the photoresist. Other portions of the photoresist are not irradiated, wherein the pattern of irradiated portions of the photoresist and portions of the photoresist that are not irradiated depends on a pattern of printing features provided on the photomask.

Thereafter, the photoresist may be developed. Depending on whether a negative or a positive photoresist is used, in the development process, either the non-irradiated portions or the irradiated portions of the photoresist are dissolved in a developer and, thus, removed from the semiconductor structure.

Thereafter, processes for patterning the semiconductor structure, which, in particular, may include one or more etch processes, may be performed, using the portions of the photoresist remaining on the semiconductor structure as a photoresist mask. Thus, features in accordance with the created layout of the integrated circuit may be formed on the semiconductor structure.

In the formation of small features in semiconductor structures, resolution enhancement techniques may be employed, wherein so-called sub-resolution assist features (SRAFs) are provided on a photomask. SRAFs are provided in addition to printing features which are employed for forming photoresist features. SRAFs may be provided in the form of small features which may, for example, have a bar shape and which are provided on the photomask in the vicinity of the printing features. Another name sometimes used is "scattering bars." When the photomask is used in a photolithography process, it is important to note that typically no features corresponding to the SRAFs are formed in the photoresist mask that is provided on the semiconductor structure. In other words, SRAF features are not printed. Instead, the presence of SRAFs may reduce a sensitivity of the photolithography process with respect to variations of parameters of the photolithography process. Such parameters may include, in particular, a focus of the projection and a dose of the radiation used for projecting the photomask to the photoresist.

Typically, two types of techniques for placing SRAFs in the layout of a photomask are applied. One of them includes rule-based SRAF generation methods. Rule-based SRAF generation methods may be fast, in terms of a computation time required for determining the placement of SRAFs, but they are typically not generic and may require significant engineering efforts to set up and maintain a set of rules, which are denoted as "recipes." Other techniques for SRAF placement include model-based methods, which may provide a higher SRAF quality at a lower recipe complexity. However, model-based methods typically require a longer run time of algorithms employed for the placement of SRAFs. SRAF shapes need to be assessed with respect to their manufacturability.

In view of the above, the present disclosure provides methods and computer readable storage media for providing a high quality of SRAF growing while being fast enough to be used for full-chip runs.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method includes providing a layout of at least a portion of a photomask, the layout comprising a plurality of target features, each target feature having a shape in accordance with a corresponding one of at least one target shape, for each of the at least one target shape, providing a local map specifying a respective value of a local sub-resolution assist feature (SRAF) usefulness for each of a plurality of positions relative to the target shape, generating a global usefulness map specifying a respective global SRAF usefulness for each of the plurality of positions relative to the at least a portion of the photomask on the basis of the assignment of the values of the local SRAF usefulness, determining a minimal threshold as well as a minimal step width for changing a threshold, determining a threshold of global SRAF usefulness of the generated global usefulness map, while the threshold is less than the minimal threshold, selecting a subset of the plurality of positions relative to the at least a portion of the photomask at which the global SRAF usefulness exceeds the threshold global SRAF usefulness and correspondingly placing minimal sized SRAFs as seeds for SRAF growth at the positions, for each of the selected seeds, growing the respective SRAF area so as to maximize the SRAF usefulness while fulfilling predetermined plausibility check rules, and changing the threshold by the step width, in case the threshold is equal to or larger than the minimal threshold, saving the generated SRAFs.

An illustrative computer readable storage medium is disclosed herein including code for causing a computer to perform the above-described method.

BRIEF DESCRIPTION OF THE DRAWINGS

The disclosure may be understood by reference to the following description taken in conjunction with the accompanying drawings, in which like reference numerals identify like elements, and in which:

FIG. 5 schematically illustrates the global usefulness map of FIG. 4 but without a grid, for better understanding;

Figure 1:
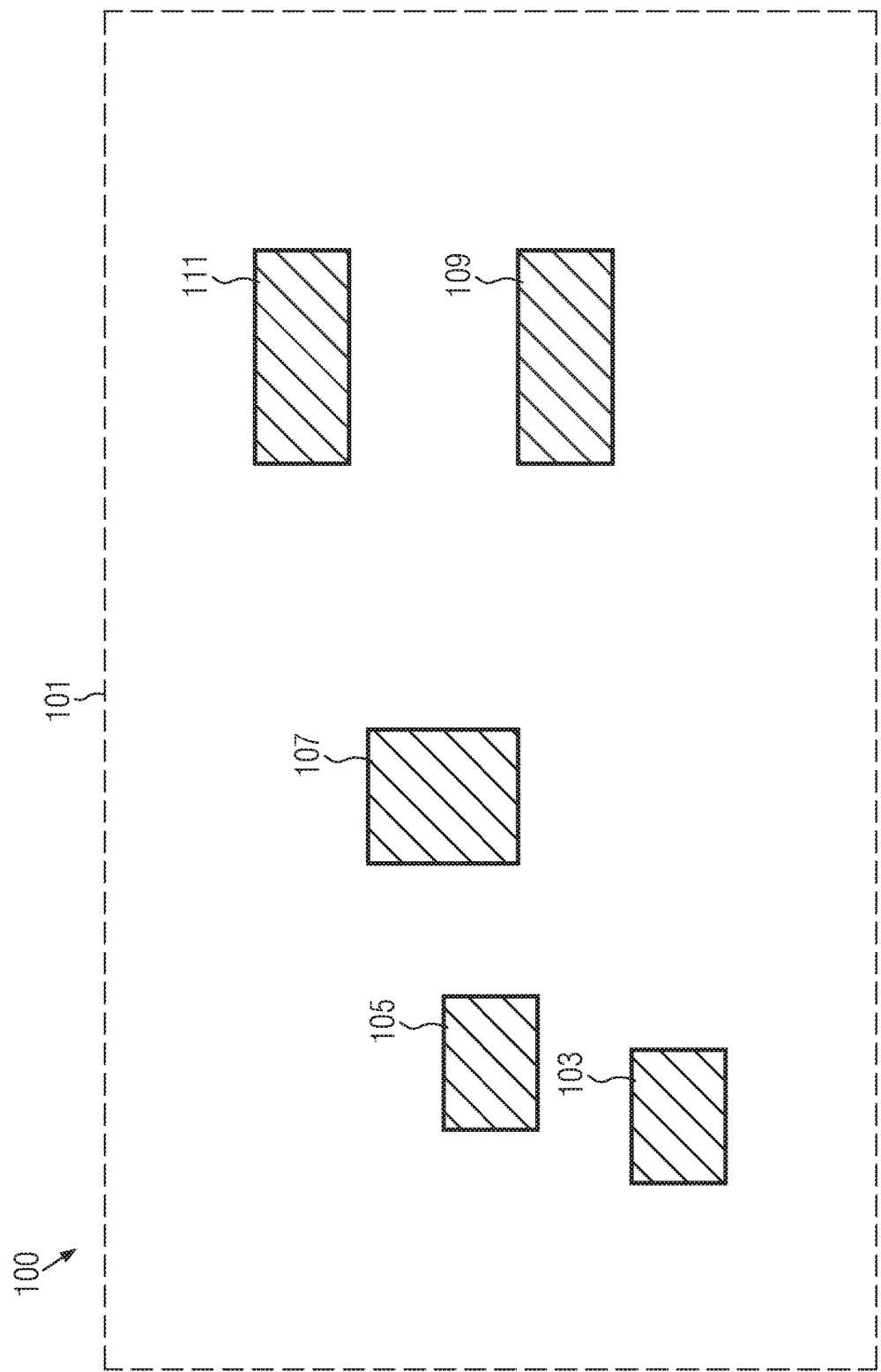
FIG. 1 illustrates a schematic view illustrating a layout of a portion of a photomask.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is generally based on the idea that an ideal placement of sub-resolution resist features (SRAFs) for individual target shapes may be known before SRAF insertion on a complex combination of target features having shapes in accordance with the target shapes starts. The proximity of a single isolated target shape may be characterized by an SRAF usefulness map. This map depicts the effect of placing an elementary SRAF on a given spot close to the target shape.

A complex pattern of target features may be combined from individual, often single, target features. This may be accomplished by an overlay of the individual target features. Each of the individual target features may have a shape in accordance with a target shape. Thus, for the complex pattern of target features, a global SRAF usefulness may be calculated in the space between the individual target features as a sum of usefulness contributions from the individual target features. As the local usefulness for individual target shapes may encompass both positive and/or negative values, also the global usefulness may exhibit positive and/or negative values. The global usefulness, thus, may be evaluated to provide guidance whether positioning an SRAF on a particular spot will have an overall positive or negative effect.

While, in the previous example, a linear addition of the contributions of the individual target features to the global usefulness may be performed, in other examples, more complex ways of deriving the global usefulness could be applied, for example, to favor smaller SRAFs or SRAFs classified by another tag. For example, the calculation of the global SRAF usefulness may include a weighted addition of the contributions of the individual target features. In some embodiments, the contribution of each target feature may be weighted inversely proportional to an area of the target feature. Alternatively, different weights may be individually assigned to different shapes.

FIG. 1 illustrates a schematic view of a layout 100 of a portion 101 of a photomask. The portion 101 of the photomask 100 includes five target features 103, 105, 107, 109 and 111. Each of the target features 103, 105, 107, 109 and 111 may define a printing feature on a photomask that corresponds to a photoresist feature that is to be formed on a surface of a semiconductor structure in a semiconductor manufacturing process. It should be understood that a set having five target features, i.e., 103, 105, 107, 109 and 111, is selected merely for illustrative purposes, but a larger or a smaller number of target features may be used, as well.

The layout 100 may be provided in the form of layout data that may be provided by means of automatic design techniques for the design of integrated circuits as described above. The layout data may specify shapes of the target features 103, 105, 107, 109 and 111 and positions of the target features 103, 105, 107, 109 and 111. The positions of the target features 103, 105, 107, 109 and 111 may be specified relative to the portion 101 of the photomask, which may represent a complete photomask.

Figure 2B:
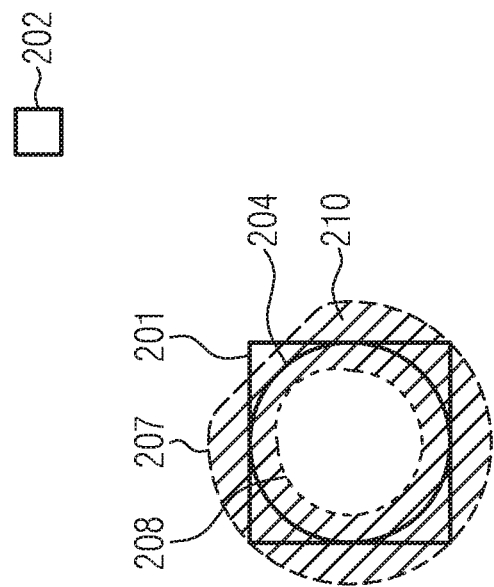
FIGS. 2a-2b illustrate schematic views of a target shape and contours of a simulated photoresist feature.
Figure 2A:
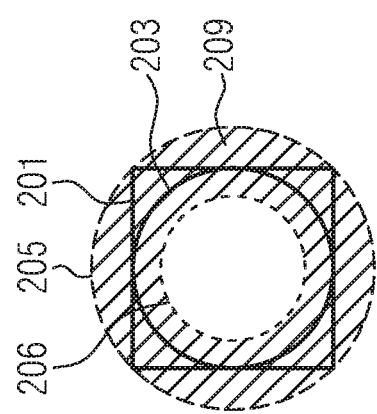

FIGS. 2a and 2b illustrate an exemplary target shape. Each of the target features 103, 105, 107, 109 and 111 of FIG. 1 may have a shape in accordance with at least one target shape. In FIGS. 2a and 2b, the exemplary target shape is a rectangular target shape, which is denoted by reference numeral 201. Typically, each of the target features 103, 105, 107, 109 and 111 may have a shape in accordance with a single target shape, which may, for example, be a rectangular shape with predetermined values of the lengths of the sides of the rectangle. Alternatively, the layout 100 may include target features of different shapes such that each of the target features has a shape in accordance with a corresponding one of a plurality of target shapes. The number of target shapes may be substantially smaller than the number of target features in the layout 100 so that, for each target shape, there is a plurality of target features having a shape in accordance with the respective target shape. Also, a hierarchical handling may be employed, wherein arrangements of target features corresponding to a particular arrangement of target shapes that occur frequently are treated as single target shapes.

Figure 3:
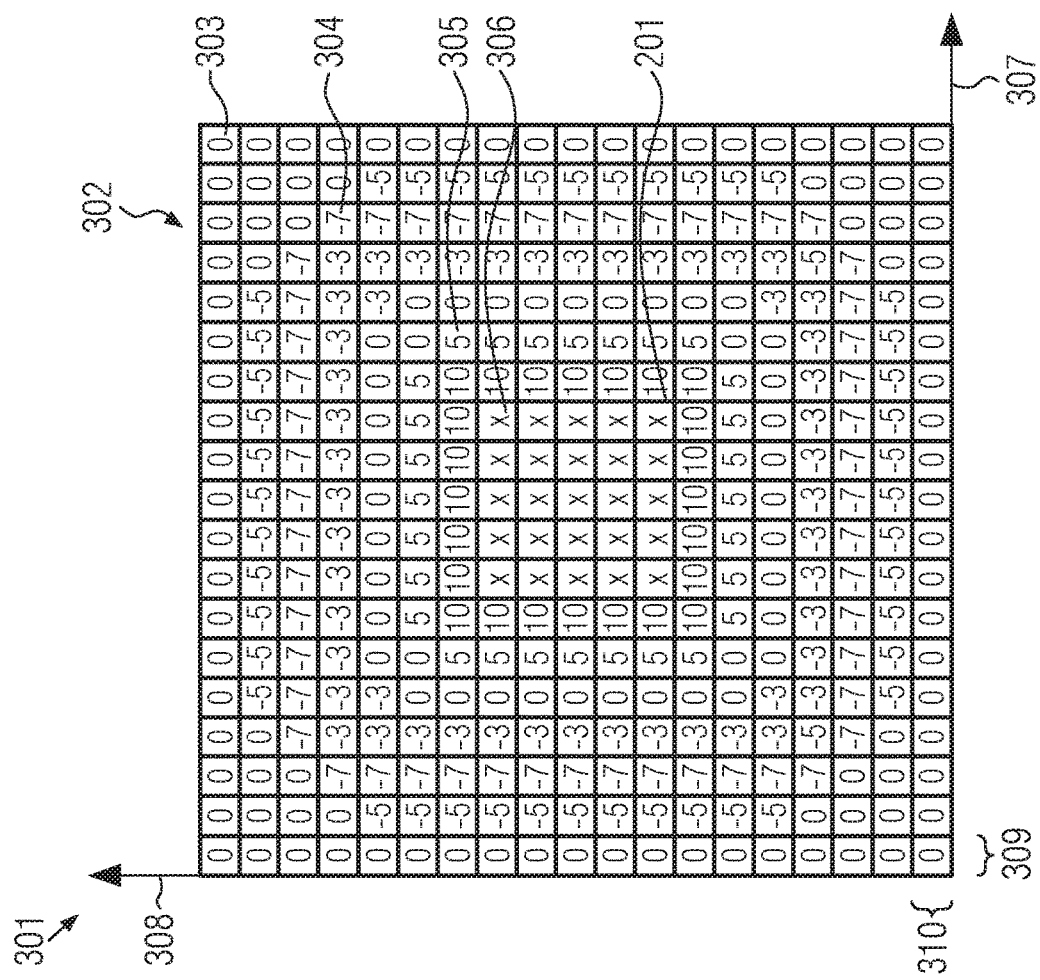
FIG. 3 schematically illustrates a local map of a local SRAF usefulness.

FIG. 3 schematically illustrates a local map 301 for the individual target shape 201 as shown in FIGS. 2a and 2b.

The local map 301 of FIG. 3 specifies a respective value of a local SRAF usefulness for each of a plurality of positions relative to the target shape 201. Each of the positions relative to the target shape 201 may correspond to a cell of a local grid 302. In FIG. 3, reference numerals 307, 308 denote coordinate axes of a local coordinate system for the target shape 201. The cells of the local grid 302 have a grid spacing 309 along the coordinate axis 307 and a grid spacing 310 along the coordinate axis 308. The grid spacing 309, 310 may be substantially equal so that the cells of the local grid 302 have a substantially square shape. Alternatively, the grid spacing 309, 310 may be different so that the cells of the local grid 302 have a rectangular shape, e.g., see FIG. 4.

Positions relative to the target shape 201 corresponding to the cells of the local grid 302 may correspond to positions of elements of the cells of the local grid 302, for example, the centers of the cells, in the local coordinate system defined by the coordinate axes 307, 308. An origin of the local coordinate system may be provided at a predetermined spatial relationship to the target shape 201.

In FIG. 3, cells of the local grid 302 within the target shape 201 have been marked with an "x." Reference numeral 306 exemplarily denotes one of the cells of the grid 302 within the target shape 201. The target shape 201 may be provided at the center of the local grid 302, and the origin of the local coordinate system defined by the coordinate axes 307, 308 may be in one of the corners of the local grid 302, for example, in the lower left corner, as shown in FIG. 3. Alternatively, the origin of the local coordinate system could be provided, for example, at the center of the target shape 201.

In FIG. 3, values of the local SRAF usefulness are indicated by numbers in cells of the local grid 302. The local SRAF usefulness for a position relative to the target shape 201 may be a quantity that is indicative of a change of a process window that is obtainable in a photolithography process wherein a photoresist is patterned with only the target shape 201 by placing an SRAF element at the position relative to the target shape 201. Since SRAFs are positioned outside the target shape 201, no values of the local SRAF usefulness need to be specified for cells of the local grid 302 that correspond to positions within the target shape 201.

It should be understood that, in FIG. 3, negative values of the local SRAF usefulness correspond to a reduction of the process window, and positive values of the local SRAF usefulness correspond to an increase of the process window. Since a reduction of the process window may improve a stability of the photolithography process with respect to fluctuations of parameters of the photolithography process, such as focus and/or dose, it may be favorable to place an SRAF element at a position relative to the target shape 201 represented by a cell of the local grid 302 having a negative value of the local SRAF usefulness. To the contrary, placing an SRAF element at a position relative to the target shape 201 represented by a cell of the local grid 302 having a positive value of the local SRAF usefulness may adversely affect the stability of the photolithography process with respect to variations of focus and/or dose. Placing an SRAF element at a position relative to the target shape 201 that is represented by a cell of the local grid 302 having a value of 0 of the SRAF usefulness may have substantially no influence on the stability of the photolithography process and/or only a relatively small influence.

In FIG. 3, reference numeral 305 exemplarily denotes one of the cells of the local grid 302 that have a positive value of the global SRAF usefulness, reference numeral 304 exemplarily denotes a cell having a negative value of the local SRAF usefulness, and reference numeral 303 exemplarily denotes a cell of the local grid 302 having a value of the local SRAF usefulness of 0.

As may be seen from the example shown in FIG. 3, cells of the local grid 302 which are close to the target shape 201 have positive values of the local SRAF usefulness, and cells of the local grid in a ring-shaped region around the target shape 201 have negative values of the local SRAF usefulness. Other cells of the local grid 302 have values of the local SRAF usefulness of 0. Thus, placing an SRAF in the ring-shaped region around the target shape 201, i.e., typically where negative values of local SRAF usefulness are given, may reduce a process window of a corresponding photolithography process wherein a photoresist is patterned with only the target shape 201.

The local map 301 may be provided as follows. In a first step, a simulation of a photolithography process wherein a photoresist is patterned with only the target shape 201 in the absence of an SRAF element may be performed. This may be done by means of known techniques for the simulation of photolithography processes. In such techniques, a model of a photolithography system may be provided. The model of the photolithography system may include a light source model that describes properties such as a spectrum and/or coherence properties of electromagnetic radiation that is used for illuminating a photomask, a photomask model that describes an interaction between the electromagnetic radiation and the photomask, an optics model that describes the formation of an aerial image by a projection lens, and a photoresist model that describes a transformation from the aerial image to a photoresist structure.

For simulating a photolithography process wherein the photoresist is patterned with only the target shape 201, a simulation of a photolithography process wherein a photomask is used that includes only a single printing feature having a shape in accordance with the target shape 201 may be performed.

Results of a simulation of a photolithography process wherein the photoresist is patterned only with the target shape 201 are schematically illustrated in FIG. 2a. In FIG.

2a, reference numeral 203 schematically denotes a contour of a photoresist feature that is obtained when parameters of the photolithography process such as focus and/or dose are near their optimum values. For convenience, in FIG. 2a, the size of the contour 203 of the photoresist feature has been enlarged by a factor that is inverse to the reduction provided by the projection lens of the photolithography system so that the contour 203 of the photoresist feature may be more easily compared with the target shape 201.

Due to wave properties of the electromagnetic radiation that is used for illuminating the photomask in the photolithography process, and/or due to characteristics of the projection lens and/or the photoresist, the contour 203 of the photoresist feature may be more rounded than the target shape 201.

Typically, a simulation process may include a plurality of simulation runs. In each of the simulation runs, different values of parameters of the photolithography process, such as focus and dose, that deviate to a certain extent from optimum values may be used, wherein variations of the parameters between the simulation runs may correspond to fluctuations of the parameters that typically occur in actual photolithography processes.

For each of the simulation runs, a contour of a simulated photoresist feature may be determined. Since, in the individual simulation runs, the parameters of the photolithography process may deviate from their optimum values, the contours of the simulated photoresist feature that are obtained in the simulation runs may slightly deviate from the contour 203. In some of the simulation runs, the simulated photoresist feature may have a greater extension than the photoresist feature that is obtained when the parameters of the photolithography process are near their optimum values. In other simulation runs, the simulated photoresist feature may have a smaller extension than the photoresist feature that is obtained when the parameters are near their optimum values.

Among the contours of the simulated photoresist feature obtained in the simulation runs, a contour of maximum area, which is denoted by reference numeral 205 in FIG. 2a, and a contour of minimum area, which is denoted by reference numeral 206 in FIG. 2a, may eventually be determined. An area between the contour 205 and the contour 206, which is denoted as "process window band" is indicated by hatching in FIG. 2a and denoted by reference numeral 209. After the simulation of the photolithography process with the target shape only, an area under the process window band 209 may be determined. The area under the process window band 209 corresponds to a difference between the area enclosed by the contour 205 of maximum area and the area enclosed by the contour 206 of minimum area.

In a next step, a plurality of simulations of photolithography processes wherein the photoresist is patterned with the target shape 201 in the presence of an SRAF element may be performed. In particular, a simulation of a photolithography process may be performed for each of the cells of the local grid 302 which are not within the target feature 201. For each cell, a photolithography process may be simulated wherein the photoresist is patterned with the target shape 201 in the presence of an SRAF element at the position relative to the target shape 201 corresponding to the respective cell of the local grid 302. FIG. 2b shows the target shape 201 and an SRAF element 202 which is exemplarily provided at a position relative to the target shape 201 corresponding to the cell 304 of the local grid 302. For simulating the photolithography process wherein the photoresist is patterned with the target shape 201 in the presence of the SRAF element 202, a simulation of a photolithography process wherein a photomask having a printing feature corresponding to the target shape 201 and a non-printing feature corresponding to the SRAF element 202 is used may be performed, which may employ similar techniques as described above with respect to FIG. 2a, i.e., with regard to the simulations without an SRAF element. The SRAF element 202 may have a shape corresponding to the shape of the cells of the local grid 302, for example, a rectangular shape having dimensions in accordance with the grid spacings 309, 310 of the local grid 302.

In FIG. 2b, reference numeral 204 denotes a contour of a photoresist feature that is obtained in the photolithography process wherein the photoresist is patterned with the target shape 201 in the presence of the SRAF element 202 when the parameters of the photolithography process are close to optimum values. Similar to FIG. 2a, the contour 204 as illustrated has been scaled. The shape of the contour 204 may be similar to the shape of the contour 203 that is obtained in the absence of the SRAF element 202.

In FIG. 2b, reference numeral 207 denotes a contour of maximum area of the photoresist feature, and reference numeral 208 denotes a contour of minimum area that are obtained in a plurality of simulation runs that are performed for the photolithography process wherein the photoresist is patterned with the target shape 201 and the SRAF element 202. Due to the influence of the SRAF element 202 on the photolithography process, the shape of the contour 207 may be different from the shape of the contour 205, the shape of the contour 208 may be different from the shape of the contour 206, and a process window band 210 between the contours 207, 208 may be different from the process window band 209 that is obtained in the absence of the SRAF element 202. In particular, for SRAF element 202 at the position relative to the target shape 201 corresponding to the cell 304, the process window band 210 may have a smaller area than the process window band 209 that is obtained in the absence of the SRAF element 202. In FIG. 2b, an area under the process window band 210, corresponding to a difference between the area of the contour 207 of a maximum area and the area of the contour 208 of a minimum area, is determined for each of the plurality of positions of the SRAF element 202 relative to the target shape 201.

Finally, a difference between the area under the process window band 209 obtained without the SRAF element and the area under the process window band 210 obtained in the presence of the SRAF element 202 is determined for each of a plurality of positions of the SRAF element 202 corresponding to cells of the local grid 302, in particular for positions outside the target shape 201. The determined differences may be provided as values of the local SRAF usefulness for the cells of the local grid 302.

In particular, values of local SRAF usefulness taking into account the above-given definitions may be assigned for a specific target shape. For applications for which a plurality of different target shapes needs to be employed, the above-described techniques may be used for providing a local map similar to the local map 301 for each of the target shapes. These values of local SRAF usefulness may then be stored in a usefulness library for a specific target shape. Thus, for a set of target shapes, for each of the target shapes at least one usefulness map may be stored so as be able to easily reproduce the usefulness map for applications.

It should be understood that the values of the local usefulness for the cells of the local grid 302 need not be provided as described above. For example, other parameters that may be determined from simulations as described above may be provided as values of the local SRAF usefulness, for example, an area of the contour 208 of minimum area, or a diameter of the contour 207 of maximum area obtained for a position of the SRAF element 202 corresponding to the cell of the local grid 302. Thus, simulations of a photolithography process wherein a photoresist is patterned with only the target shape in the absence of an SRAF element as described above with reference to FIG. 2a may be omitted and only simulations of a photolithography process wherein the photoresist is patterned with the target shape 201 in the presence of an SRAF element as described above with reference to FIG. 2b are performed.

Figure 4:
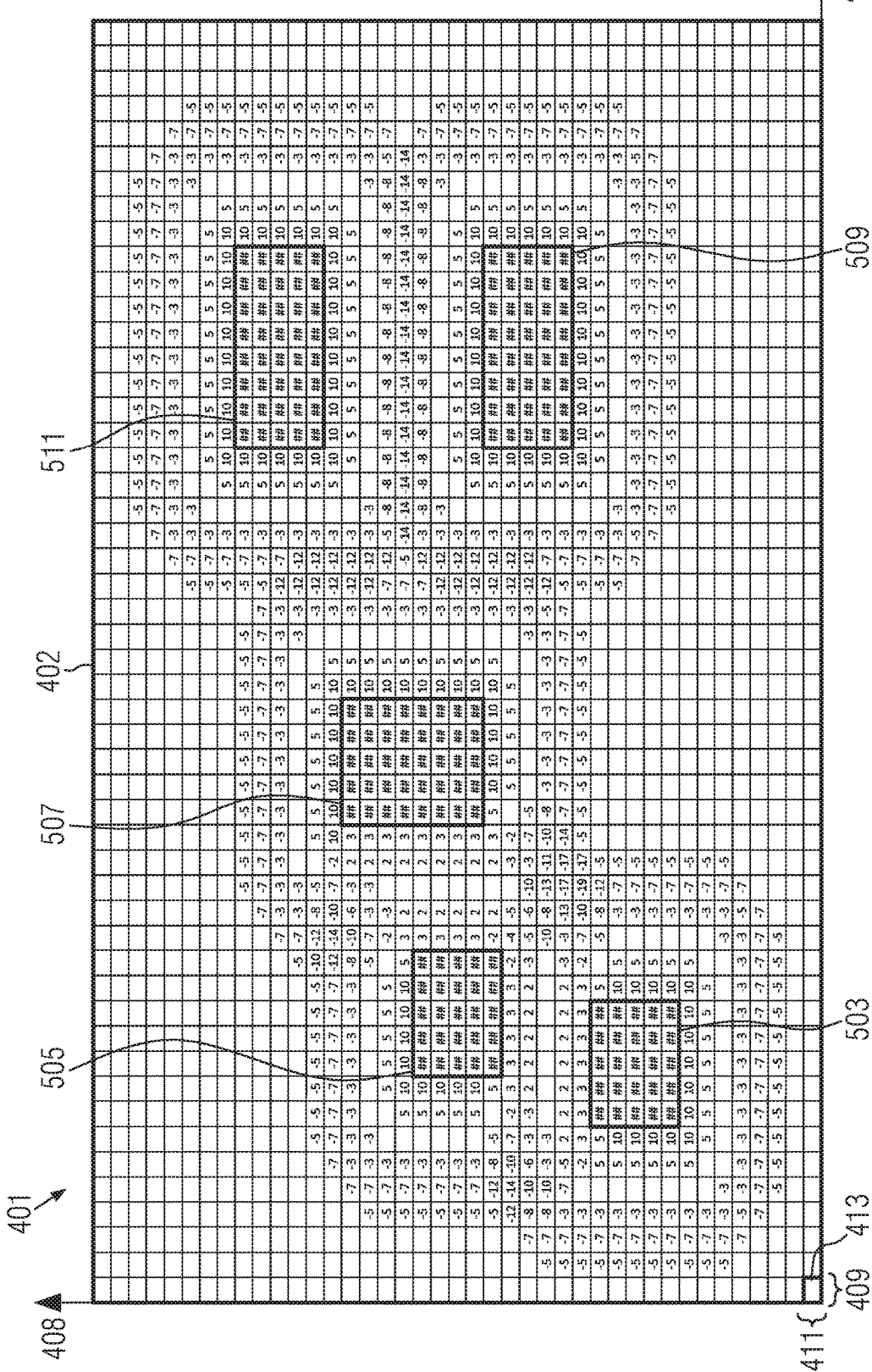
FIG. 4 schematically illustrates a global usefulness map of a global SRAF usefulness for several target shapes.

FIG. 4 illustrates a global map 401 of SRAF usefulness, in short called a global usefulness map, for a set of five target shapes 503, 505, 507, 509 and 511 which may correspond to the five target shapes 103, 105, 107, 109 and 111 shown in FIG. 1. It should be understood again that the number of five target shapes is chosen here only for illustrative purposes, but a corresponding map could have a different number of target shapes. In particular, for exemplary purposes only, target shapes 501 and 502 are similar to target shape 201 as shown in FIG. 3 and local usefulnesses of target shapes 501 and 502 correspond to the usefulness determined for and assigned to target shape 201 of FIG. 3. Again, for illustrative purposes only, the target shapes 507 and 509 have a slightly different yet still rectangular shape when compared to the target shapes 501 and 502. In correspondence to FIG. 1, the global usefulness map 401 specifies a respective global SRAF usefulness for a plurality of positions relative to a portion of a photomask, such as the portion 101 including target shapes 103, 105, 107, 109 and 111 as shown for the layout 100 in FIG. 1. In FIG. 4, similar to FIG. 3, a global grid 402 is shown. The global grid 402 of FIG. 4 is shown by a Cartesian coordinate system having axes 407 and 408, respectively. Thereby, grid cells are defined, which in the exemplary case of FIG. 4 are rectangular, but may be quadratic as in FIG. 3, as well. The values of the global SRAF usefulness are given in cells of the global grid 402 representing the values of the global SRAF usefulness of the global usefulness map 401, which is shown in FIG. 4. Cells of the global grid 402 within the target features 103, 105, 107, 109 and 111, and, therefore, correspondingly for the five target shapes 503, 505, 507, 509 and 511 need not be provided with values of the global SRAF usefulness. For illustrative purposes only, such cells are denoted here by a double hash sign, "##".

In the example illustrated in FIG. 4, the values of the global SRAF usefulness for the positions relative to the portion 101 of the photomask corresponding to cells of the global grid 402 may be obtained by summing the values of the local SRAF usefulness assigned to the positions relative to the portion 101 of the photomask corresponding to the cells of the global grid 402. For each of the cells of the global grid 402 that are not within one of the target features target shapes 503, 505, 507, 509 and 511, a value of the global SRAF usefulness being a sum of the values of the local SRAF usefulness of each of the cells of the contributing target shapes 503, 505, 507, 509 and 511 may be calculated. In FIG. 4, for illustrative purposes only and unlike FIG. 3, cells having a global SRAF usefulness value of 0 are shown as "blank" cells, i.e., no numbers are shown in these cells.

It should also be understood that, for FIGS. 3 and 4, usefulness values are given up to 6-7 columns and rows, respectively, from the respective edge of a rectangular cell of the grid. However, grids may be finer and grid spacing may be smaller than shown in FIGS. 3 and 4.

In FIG. 4, reference numeral 413 denotes an exemplary cell of the global grid 402 well clear of any overlapping areas around the target shapes 503, 505, 507, 509 and 511. Exemplary cell 413 has a value of the global SRAF usefulness of 0. Together with exemplary cell 413 also the granularity of the grid 402 is indicated by a grid spacing 409 along coordinate axis 407 and a grid spacing 411 along the coordinate axis 408, thereby indicating a rectangular shape of exemplary cell 413.

The present disclosure is not limited to a summation of the values of the local SRAF usefulnesses as described above performed for obtaining the values of the global SRAF usefulness. Alternatively, for each of a plurality of positions relative to the portion 101 of the photomask corresponding to cells of the global grid 402, a function of each of the values of the local SRAF usefulness assigned to the respective position relative to the portion 101 of the photomask may be calculated, wherein the function may be a function that is different from the above-described sum of the values of the local SRAF usefulness. For example, the function may include a weighted sum of the values of a local SRAF usefulness that are assigned to the cells of the global grid, as will be detailed below.

Figure 5:
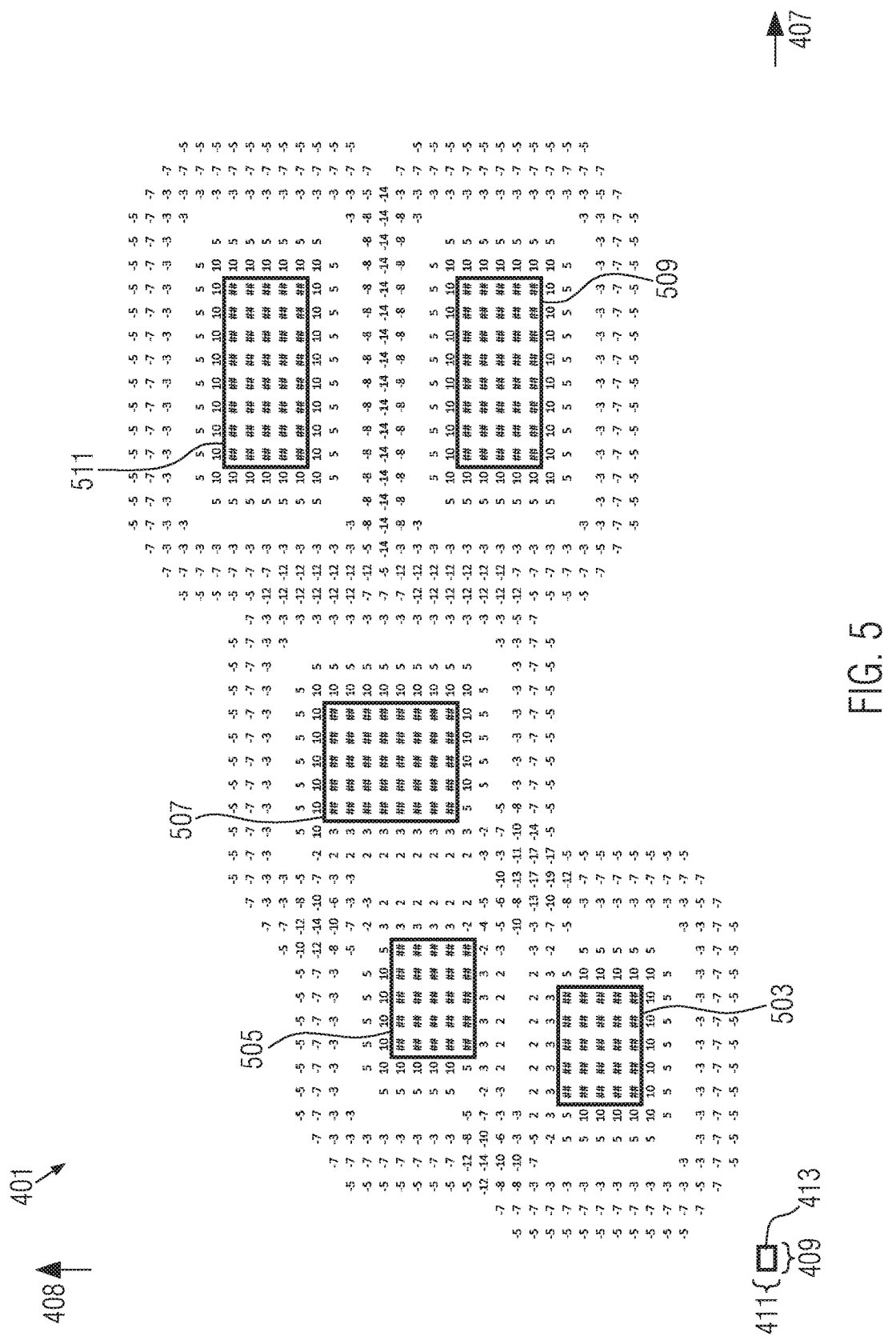

FIG. 5 basically repeats the illustration of FIG. 4 but, for illustrative purposes only, without explicitly showing the cells of the grid 402 except for the exemplary cell 413.

Figure 6:
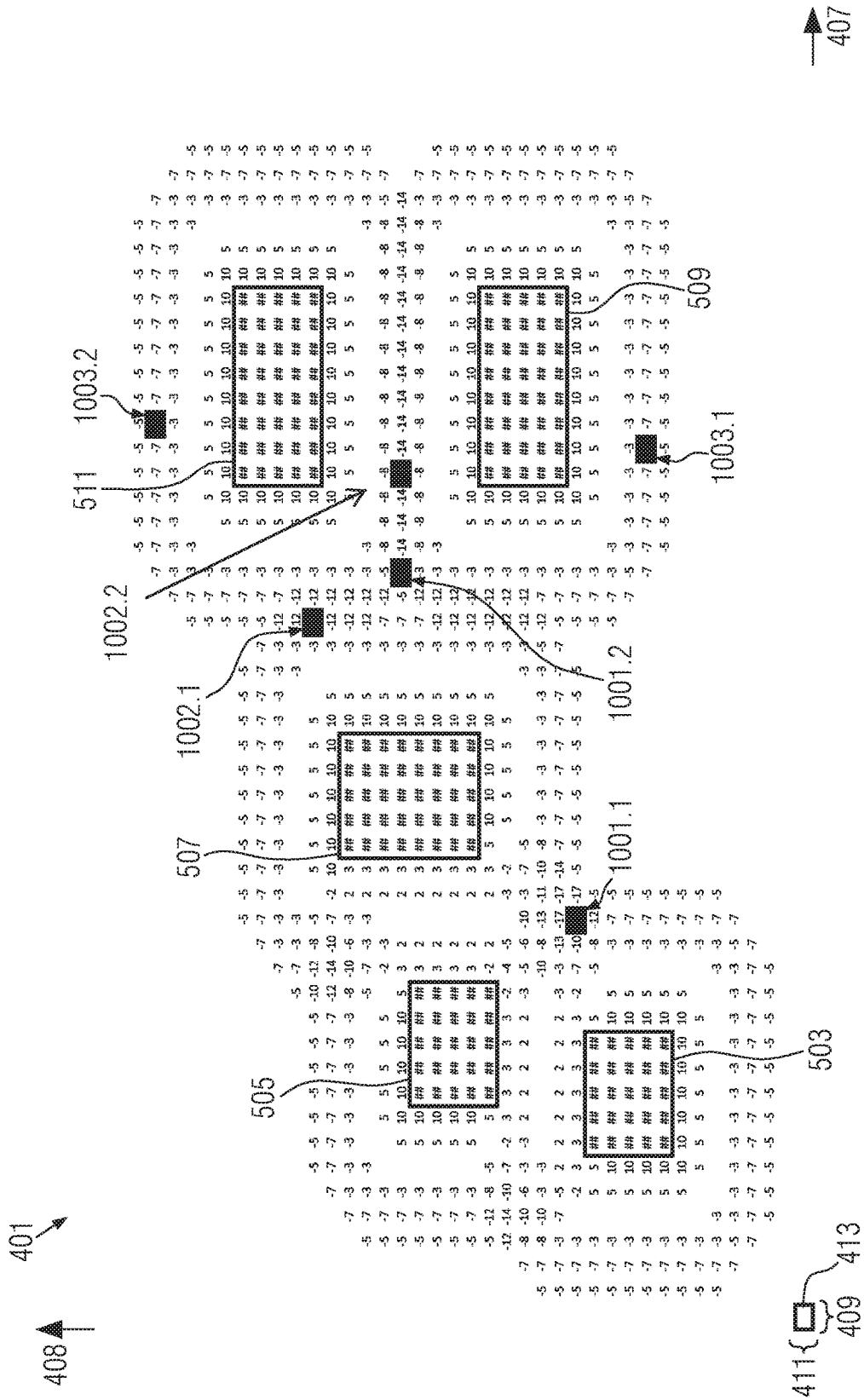
FIG. 6 schematically illustrates the global usefulness map of FIG. 5 with seeds for growth of SRAFs.
Figure 7:
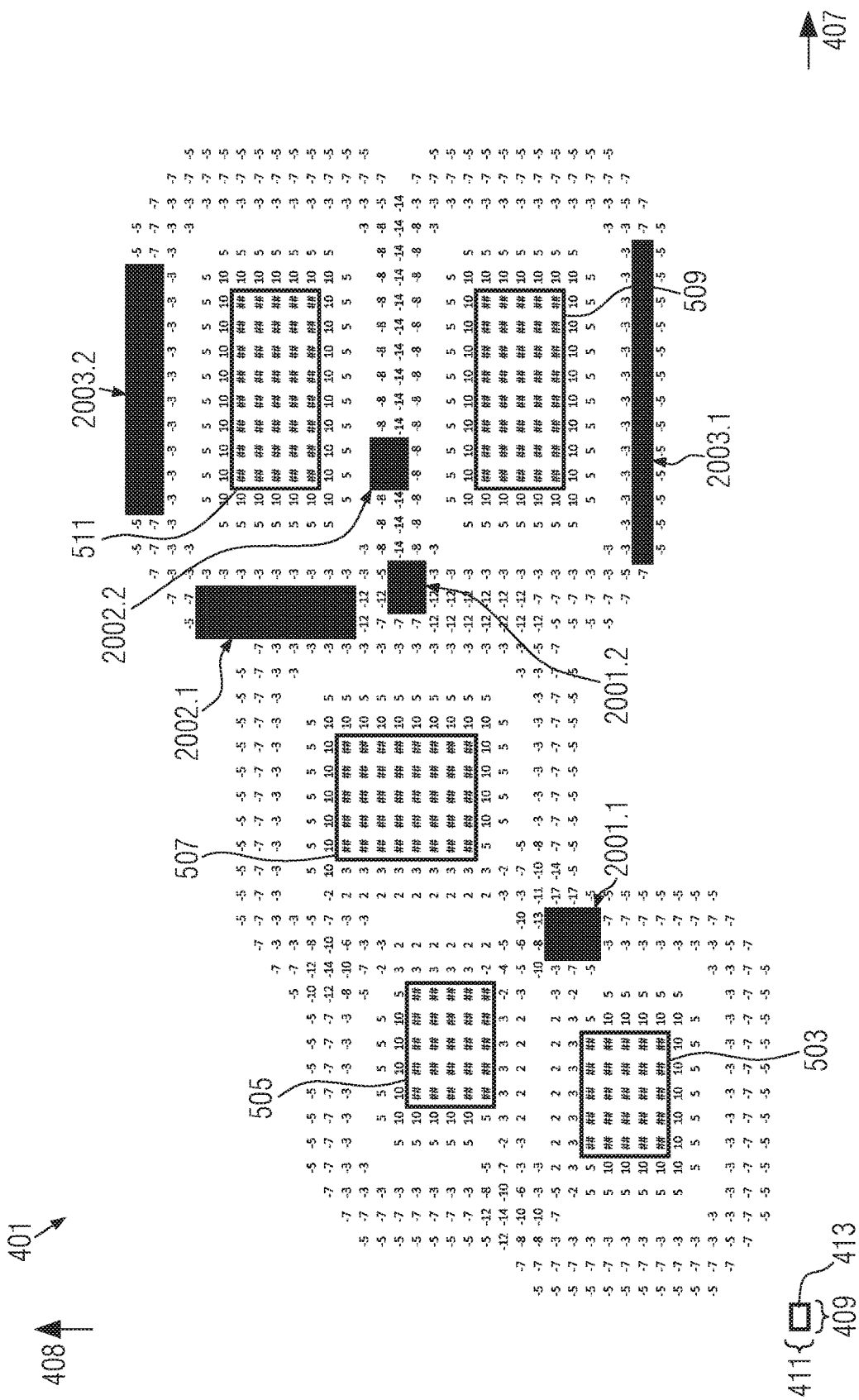
FIG. 7 schematically illustrates the global usefulness map of FIG. 5 with grown SRAFs after three iterations.

FIG. 6 builds up on the illustration of FIGS. 4 and 5. Having determined, stored and reproduced, i.e., re-read from storage, a global usefulness map for a set of target shapes as exemplarily shown in FIGS. 4 and 5, the problem is how to convert said usefulness map into SRAF shapes which are compatible with state-of-the-art manufacturing rules. FIG. 6, illustrates the starting point of an iteration which will be described in detail with respect to FIG. 8. Correspondingly, FIG. 7 shows an intermediate or a final result after a number of iterations as will be discussed in detail with respect to FIG. 8.

Figure 8:
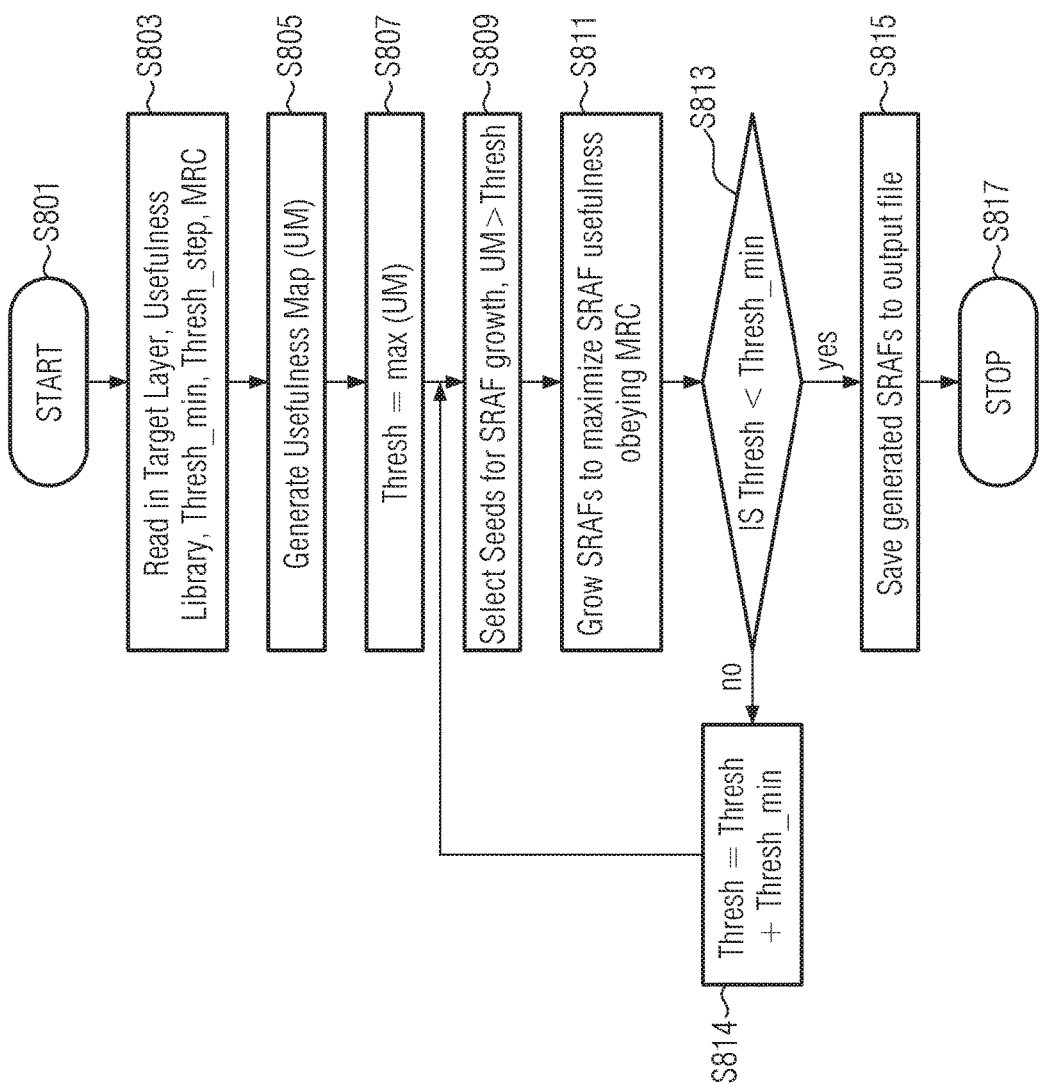
FIG. 8 depicts a method for growing SRAFs in accordance with FIGS. 4, 5 and 6.

FIG. 8 illustrates the underlying method. In Step S801 the method starts. As discussed with respect to FIGS. 1-4, a predetermined, prestored library of usefulness values for target features, in particular individual target features, may be provided. The values which are prestored in this library may be determined according to the simulation procedure described above with respect to FIGS. 2a, 2b and 3.

In Step S803, a target layer, i.e., an outline of a set or assembly of target shapes, is read in. This may be the set of five target shapes 503, 505, 507, 509 and 511 as used in FIGS. 4-7. Moreover, a minimal threshold value, which may be denoted Thresh_min, is also read from the library data, which is read from a storage. Also, in view of iterations, an appropriate step width or "delta" for the iteration may be read from the library data, as well. It should be understood that it is also possible that such values may be input by a user or may be determined from a yet to be generated global usefulness map, i.e., after step S805.

In Step S805, a global usefulness map is generated by summing up the local usefulness maps of each of the target shapes. Taking into account the five target shapes 503, 505, 507, 509 and 511 of FIG. 4, a global usefulness map such as the global usefulness map 401 of FIG. 4 may be the result.

In step S807, the iteration aiming at SRAF growth begins. For the global usefulness map 401, the placement of SRAFs may include applying a threshold of global SRAF usefulness to the global usefulness map 401. Thereby, a subset of cells, e.g., very few cells of the many cells shown in FIGS. 4 and 5, may be selected. These very few cells may be located at positions relative to the portion 101 of the photomask corresponding to cells of the global grid 402 at which the global SRAF usefulness exceeds the threshold global SRAF usefulness. In particular, the threshold global SRAF usefulness may have a negative value, and the subset of the plurality of positions relative to the portion 101 of the photomask may include positions relative to the portion 101 of the photomask wherein the global SRAF usefulness is smaller, meaning here more negative than the threshold SRAF usefulness. Step S809 then corresponds to selecting seeds for the iteration, corresponding to the few cells determined with respect to the threshold of the usefulness map. Thus, the subset of the plurality of positions relative to the portion 101 of the photomask includes positions where a placement of an SRAF may be particularly advantageous in view of an improvement of a stability of a photolithography process. For practical purposes, the threshold is determined to be close to its respective usefulness maximum, thereby avoiding that only a single cell corresponding to a single position may be found. Thus, an example of such a value may be 2-5% above the threshold value or, in other words, the magnitude of the threshold value may be reduced by about 2-5%. If needed, a larger range may be applied.

FIG. 6 illustrates the global usefulness map 401 of FIG. 4 but displaying selected seeds for iterations. Reference numbers 1001.1 and 1001.2 refer to positions of cells having a particular negative value of global SRAF usefulness. These cells may serve as seeds for a first iteration of the method of FIG. 8.

In step S811, the method continues by growing, i.e., attempting to enlarge the SRAFs starting from the seeds of SRAFS. For a first iteration, this is performed for the seeds of SRAFs with reference numbers 1001.1 and 1001.2. The underlying idea of growing corresponds to maximize the usefulness of the SRAFs, e.g., the integral usefulness of the cells or pixels of the usefulness map which are covered by the SRAFs. As long as the increase of usefulness continues, the iteration in principle may continue provided that no other stop criteria are fulfilled. Taking into account the rectangular shape of the seeds of SRAFs 1001.1, 1001.2, each of the four edges of the respective SRAFs 1001.1, 1001.2 is evaluated with respect to the possibility of further expanding it. Thus, one by one, the upper, the lower, the left and the right edge of the respective seeds of SRAFs 1001.1, 1001.2 are shifted by a predefined or available smallest unit of increase on the underlying grid. This may typically be the cell size in the respective horizontal (407) or vertical (408) direction of the grid of the global usefulness map 401, given that the granularity, i.e., grid spacing, of the global usefulness map 401 is predetermined. Thus by moving one of the edges such that the area covered by the SRAF is enlarged, the SRAF usefulness may be calculated. The calculation may again include the type of calculations as discussed with regard to FIGS. 2a, 2b and 3. If the enlarging of area increases the SRAF's usefulness, the expansion with regard to the respective edge is continued, otherwise the respective edge is excluded from further growth, such that its current position may be frozen. Thus, at most, four tests corresponding to the four edges of the SRAF with respect to expansion of the SRAF area may be performed per SRAF.

In addition to this usefulness criterion, the growing step may also include a plausibility check to be performed at each step. Plausibility may be checked by employing so-called mask rule compliance (MRC). The underlying idea is that, even with optimized SRAFs, the resulting photomasks still need to be manufacturable. This may be thought of as being a comprehensive geometric intensity test to be performed before the mask is manufactured. Testing SRAFs or an arrangement of SRAFs against such rules may include constraints that are provided for ensuring mask rule compliance by optical proximity correction software provided by vendors of machines for performing optical proximity correcting. Alternatively, dummy or values gathered from experience may be used. If such MRC rules are violated by the expansion, the expansion is stopped and the corresponding edge of the SRAF is marked as final. An additional test which is closely related to the geometrical test of whether or not the enlarged SRAF obeys predetermined MRC rules is a check of whether or not two different SRAFs would touch each other or would come closer than a predetermined distance to each other. This additional test is optional but may be easily integrated into the method.

Figure 9:
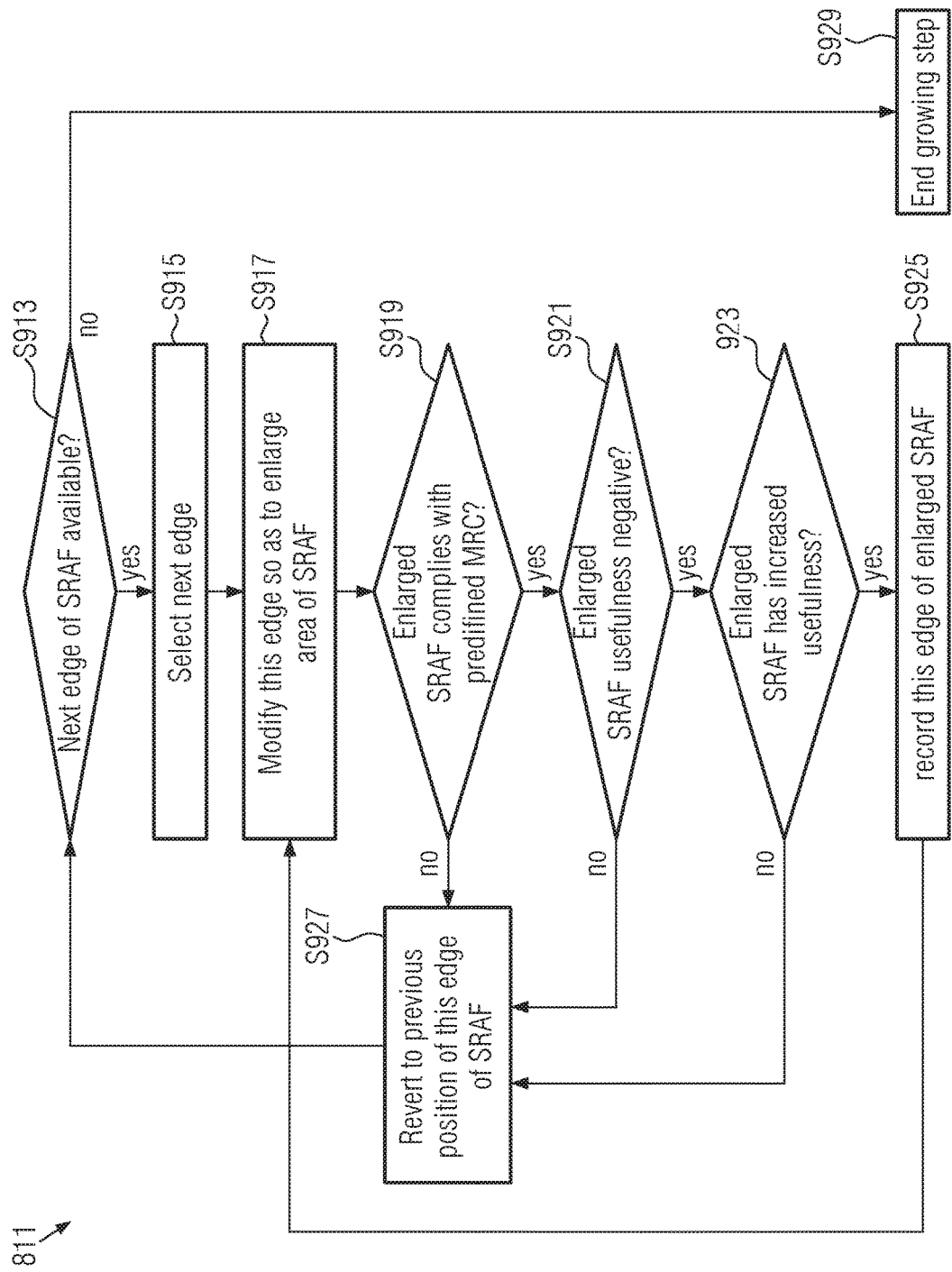
FIG. 9 depicts a detail of the growth step of the method of FIG. 8.

In detail, the growth step S811 is illustrated in FIG. 9. Having selected at least one seed, such as seeds 1001.1 and 1001.2, in the previous step S809, the growth step S811 starts with step S913 by selecting the next available edge of the seed of the SRAF. It should be noted that also the seeds share a similar, i.e., in this example, a rectangular shape. An edge of the SRAF, or the seed of the SRAF, should be considered to be available if none of the stop criteria S919, S921, S923 has been fulfilled, which should be considered to be true at the start of the iteration. In case no edge is available, i.e., all four of the edges of the SRAF have been tested, the growth step ends at S929. Otherwise, in S915. the next available edge is selected. In step S917, this selected edge is modified so as to enlarge the area of the SRAF, as discussed already, above.

In step S919, it is checked if the enlarged SRAF complies with the above-discussed MRC rules. If this is not the case, the modification of the edge of step S917 is retracted and, in step S927, it is reverted to the previous position of this edge of the SRAF. This also means that this edge may not be further modified for this iteration such that it is returned to step S913 for selecting another edge, if available.

The usefulness of the enlarged SRAF is calculated as described with respect to FIGS. 2a, 2b and 3. In step S921, it is checked if the usefulness of the enlarged SRAF is still negative. In case it is 0 or even positive, the modification of the edge of step S917 is retracted and, in step S927, it is reverted to the previous position of this edge of the SRAF. In case the usefulness is still negative, the process proceeds. It should be understood that, for step S921, instead of checking if the usefulness of the enlarged SRAF is still negative, step S921 may be modified to check against a predefined threshold which may be different from 0.

In step S923, it is checked if the usefulness of the enlarged SRAF has increased as compared to the usefulness of the SRAF before the modification. If it has not increased, the modification of the edge of step S917 is retracted and, in step S927, it is reverted to the previous position of this edge of the SRAF. If the usefulness has increased, i.e., it has become more negative, the method continues.

In step S925, the position as well as usefulness and, if necessary, other parameters of the enlarged SRAF are recorded and the process continues by step S917 by closing the loop so as to further modify the same edge of the SRAF in order to test how much further this edge may be modified.

It should be noted that the order of steps S919, S921 and S923 may be chosen differently as in the present example so as it may serve best for calculatory purposes as long as all three stop criteria are tested.

Returning to FIG. 8, the method of FIG. 8 continues by checking a possible modification of the threshold in step S813.

For illustration, it is referred to FIG. 6. In FIG. 6, further seeds 1002.1 and 1002.2 for a second iteration, as well as 1003.1 and 1003.2 for a third iteration are shown. Depending on the convergence of the iteration, several iterations may be needed. Before any new iteration, in step S813, it is tested whether the minimum threshold, which was predetermined or determined in step S803, i.e., before the start of the iteration in step S809, has already been reached. It should be noted that, in accordance with the discussion above, iteration should also stop if the usefulness reaches a value of zero. If not, the next threshold value for the loop is determined by modifying the threshold by the step width/delta in step S814 as discussed above. Once the test of step S813 provides the result that the minimum threshold has been reached, the iteration stops. An exemplary result is shown in FIG. 7, showing resulting SRAFs 2001.1, 2001.2 from the first iteration, 2002.1, 2002.2 from the second iteration and 2003.1, 2003.3 from the third iteration in this example. As indicated above, this is shown for illustrative purposes only, and the resulting shapes of SRAFs may look different than what is shown here.

The resulting SRAFs 2001.1, 2001.2 from the first iteration, 2002.1, 2002.2 from the second iteration and 2003.1, 2003.3 from the third iteration of this example may then be output to a file in step S815 after which, in step S817, the method may stop.

The above-described method may be programmed by using any appropriate programming environment, e.g. MAT-LAB®, or similar environments and has been benchmarked to be considerably faster than available model-based and rule-based SRAF insertion solutions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
providing a layout of at least a portion of a photomask, said layout comprising a plurality of target features, each target feature having a shape in accordance with a corresponding one of at least one target shape;
for each of said at least one target shape, providing a local map specifying a respective value of a local sub-resolution assist feature (SRAF) usefulness for each of a plurality of positions relative to said target shape;
generating a global usefulness map specifying a respective global SRAF usefulness for each of said plurality of positions relative to said at least a portion of said photomask on the basis of the assignment of the values of said local SRAF usefulness;
determining a minimal threshold as well as a minimal step width for changing a threshold;
determining a threshold of global SRAF usefulness of said generated global usefulness map;
while said threshold is less than said minimal threshold: selecting a subset of said plurality of positions relative to said at least a portion of said photomask at which said global SRAF usefulness exceeds said threshold global SRAF usefulness and correspondingly placing minimal sized SRAFs as seeds for SRAF growth at said positions;
for each of said selected seeds, growing the respective SRAF area so as to maximize said SRAF usefulness while fulfilling predetermined plausibility check rules; and
changing said threshold by said step width;
in case said threshold is equal to or larger than said minimal threshold, saving said generated SRAFs; and
manufacturing a photomask comprising the plurality of target features and said generated SRAFs.

2. The method of claim 1, wherein growing said respective SRAF area comprises selecting a next edge of said respective SRAF available for modification and, if a next edge of said SRAF is available, moving said edge by a predetermined granularity so as to enlarge said SRAF area and thereby obtain a latest change of said SRAF.

3. The method of claim 2, wherein if a next edge of said SRAF is not available, ending said growing step.

4. The method of claim 2, wherein said growing step comprises calculating a SRAF usefulness of said enlarged SRAF.

5. The method of claim 4, wherein said plausibility check rules comprise checking if said calculated SRAF usefulness of said enlarged SRAF is equal to or larger than a predetermined level, and if this check is affirmative, taking back the latest change of said SRAF, else continuing said growing step.

6. The method of claim 5, wherein said predetermined level is zero.

7. The method of claim 1, wherein said plausibility check rules comprises checking mask rule compliance (MRC) and if the check is not affirmative, taking back the latest change of said SRAF, else continuing said growing step.

8. The method of claim 7, wherein said MRC rules are predetermined rules provided from geometrical constraints and/or from vendors of optical proximity correction software.

9. The method of claim 7, wherein said plausibility check rules further comprise checking if said enlarged SRAF is closer to another SRAF than a predetermined distance and if the check is affirmative, taking back the latest change of said SRAF, else continuing said growing step.

10. The method of claim 4, wherein said growing step further comprises checking if said calculated SRAF usefulness of said enlarged SRAF has increased, i.e., become more negative, and if the answer is not affirmative, taking back the latest change of said SRAF, else recording the position of the modified edge and continuing said growing step.

11. The method of claim 1, wherein providing a layout of said at least a portion of said photomask and/or providing a local map specifying a respective value of said local sub-resolution assist feature (SRAF) usefulness for each of said plurality of positions relative to said target shape for each of said at least one target shape comprises reading said layout of said at least a portion of said photomask and/or reading said local map of SRAF usefulness for each of said at least one target shape from a prestored library.

12. The method of claim 1, wherein determining said minimal threshold as well as said minimal step width for changing a threshold comprises reading said minimal threshold as well as said minimal step width from a prestored library.

13. The method of claim 1, wherein said local SRAF usefulness for said position relative to said target shape is a parameter being indicative of a change of a process window obtainable in a photolithography process wherein a photoresist is patterned with only said target shape by placing an SRAF element at said position relative to said target shape.

14. The method of claim 1, wherein generating said global usefulness map comprises calculating, for each of said plurality of positions relative to said at least a portion of said photomask, a value of a function of each of said values of said local SRAF usefulness assigned to the respective position relative to said at least a portion of said photomask.

15. The method of claim 14, wherein the function comprises a sum of each of said values of said local SRAF usefulness assigned to the respective position relative to said at least a portion of said photomask.

16. The method of claim 1, wherein selecting a subset of said plurality of positions relative to said at least a portion of said photomask at which said global SRAF usefulness exceeds said threshold global SRAF usefulness comprises selecting said subset of said plurality of positions relative to said at least a portion of said photomask at which said global SRAF usefulness exceeds said threshold of global SRAF usefulness, wherein a magnitude of said threshold is reduced by 2-5%.

17. The method of claim 1, wherein said placing of said one or more SRAFs in said layout on the basis of said global usefulness map comprises:
    approximating said selected subset of said plurality of positions by means of a plurality of substantially rectangular SRAF elements.

* * * * *